United States Patent [19]

Maio et al.

[11] Patent Number: 4,578,646

[45] Date of Patent: Mar. 25, 1986

[54] INTEGRAL-TYPE SMALL SIGNAL INPUT CIRCUIT

[75] Inventors: Kenji Maio, Tokyo; Atsushi Moritani, Kokubunji, both of Japan

[73] Assignees: Hitachi, Ltd; Hitachi Medical Corporation, both of Tokyo, Japan

[21] Appl. No.: 577,972

[22] Filed: Feb. 8, 1984

[51] Int. Cl.[4] .................................... H03K 5/01

[52] U.S. Cl. .................................... 328/128; 307/353; 307/491; 328/151

[58] Field of Search ............... 307/353, 352, 491, 494, 307/268; 328/128, 151, 162, 165, 167

[56] References Cited

U.S. PATENT DOCUMENTS

| | | | |
|---|---|---|---|
| 3,516,002 | 6/1970 | Hillis | 307/353 |
| 4,163,947 | 8/1979 | Weedon | 328/128 |
| 4,302,689 | 11/1981 | Brodie | 307/353 |
| 4,352,070 | 9/1982 | Beauducel et al. | 307/353 |

*Primary Examiner*—John Zazworsky

*Attorney, Agent, or Firm*—Antonelli, Terry & Wands

[57] ABSTRACT

An integral-type small signal input circuit having a Miller integrator is adapted to perform cyclically an integrating operation, a resetting operation and an input offset current compensating operation. An input offset current compensation circuit which forms a feedback circuit of the amplifier in the Miller integrator is arranged to supply a compensation current to the amplifier for canceling the input offset current during the compensating operation and to supply the held compensation current to the amplifier during the integrating operation. During the compensation period, a low-pass filter which blocks sinusoidal noise components in the input signal is connected to the input of the integrator so that the held compensation current is not affected by the noise components.

6 Claims, 6 Drawing Figures

INTEGRAL-TYPE SMALL SIGNAL INPUT CIRCUIT

BACKGROUND OF THE INVENTION

The present invention relates to a small signal input circuit which integrates a small input signal for a certain time length and transmits the integrated signal as input data and, more particularly, to an integral-type input circuit suitable for use in an X-ray CT system for receiving X-ray image signals.

It is a common practice in X-ray CT systems to receive a small current signal from each X-ray sensor by integrating it for a certain period and to provide an amplified voltage signal. The sensor current generally includes an offset current, such as a leakage current, which causes error in the integrated signal. Therefore, some compensating means for the offset current is needed in order to provide an accurate integration output for the input current signal.

U.S. Pat. No. 4,163,947 discloses an integration circuit provided with means for compensating the input offset current. This circuit has a compensation amplifier which supplies a current corresponding to a voltage held by an input capacitor to the input of the integration amplifier. During the compensation period between periods of integration, the compensation amplifier is coupled to the feedback loop of the amplifier so that the capacitor voltage follows the input offset current, thereby supplying a compensation voltage held in the capacitor for canceling the offset current to the integration amplifier during the integration period. Although this compensating means functions to compensate an input offset current which varies slowly enough to be regarded as a direct current as compared with the iterative period of integration, if the offset current includes a sinusoidal component, the capacitor voltage will follow this component, resulting in an erroneous voltage held in the capacitor, and accurate compensation cannot be expected. Particularly, the input circuit of the X-ray CT system is susceptible to the interference of a relatively low frequency noise current created by the mechanical vibration due to the rotation of the sensor in addition to the slow-varying leakage current, and therefore, the abovementioned conventional integration circuit does not meet the requirement as an input circuit of the X-ray CT system.

SUMMARY OF THE INVENTION

Accordingly, it is an object of the present invention to provide a small signal integral input circuit capable of integrating the input signal accurately by fully compensating the input offset current including sinusoidal components.

Another object of the invention is to provide a small signal integral input circuit which does not respond to unwanted noises during the absence of the input signal within the period of integration.

One aspect of the present invention resides in the circuit arrangement comprising a Miller integrator having an input resistor with its one terminal receiving an input signal, an integration amplifier connected to another terminal of the input resistor, and an integration capacitor forming a feedback loop of the integration amplifier during a period of integration, and an input offset current compensation circuit having voltage hold means and a compensation amplifier and adapted to form a feedback loop of the integration amplifier during a period of compensation between consecutive integration periods and supply a compensation current corresponding to a voltage held in the hold means to the input of the integration amplifier during the integration period, the input resistor being provided with a low-pass filter which operates during the compensation period, but is released from operation in at least part of the integration period.

Namely, the inventive arrangement contemplates to shut out sinusoidal components in input offset current which is prejudicial to the setup of a compensation current during the compensation period, thereby carrying out accurate current compensation without being affected by the sinusoidal noise components, and to perform highresponse integration of the input signal at least in part of the integration period. Although the holding voltage could be tolerant of a varying input offset current without the provision of the low-pass filter at the sacrifice of response in the loop of offset compensation circuit, a longer compensation period would be needed in that case for setting up a hold voltage and, thus, an accurate compensation current. On the other hand, the foregoing inventive arrangement provides an accurate compensation current without being affected by sinusoidal components in the offset current while retaining the high response of the loop of input offset current compensation circuit, whereby a small signal integral input circuit with shorter compensation period. Thus, higher operating response can be achieved.

Moreover, in the case where the duration in which the input signal is applied to the circuit is limited to a predetermined duration within the integration period, the Miller integrator can be shut off from unwanted noise currents by releasing the low-pass filter from operation only within the predetermined duration.

DESCRIPTION OF THE PREFERRED EMBODIMENTS

Figure 1:
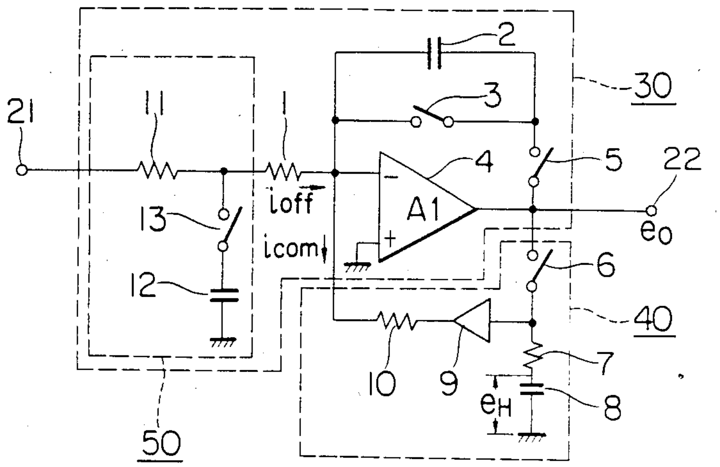
FIGS. 1, 3 and 5 are schematic diagrams showing embodiments of the present invention.

In FIG. 1 showing one embodiment of the present invention, an integration amplifier 4 has a non-inverting input terminal connected through input resistors 1 and 11 to a signal input terminal 21. The amplifier 4 has a connection of a feedback loop including a switch 5, integration capacitor 2 and reset switch 3 to constitute a Miller integrator 30. The combination of a switch 6, resistor 7, capacitor 8, amplifier 9, and current limiting resistor 10 constitutes an input offset current compensation circuit 40. The node of the input resistors 1 and 11 is grounded through a switch 13 and capacitor 12, and thus a low-pass filter 50 is constituted by the resistor 11 and capacitor 12 when the switch 13 is closed.

Figure 2:
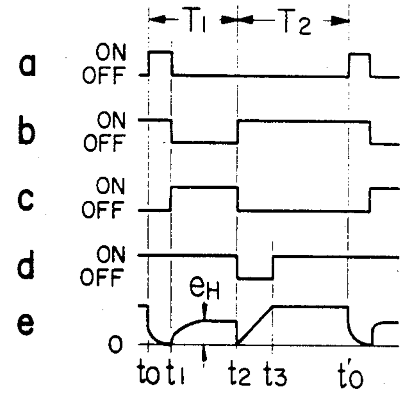
FIGS. 2, 4 and 6 are timing charts showing the signal waveforms observed at various portions of the circuit arrangements shown in FIGS. 1, 3 and 5, respectively.

FIG. 2 is a set of waveform diagrams for the arrangement of FIG. 1, where waveforms a, b, c and d represent the ON and OFF states of the switches 3, 5, 6 and 13, respectively, and waveform e represents the signal voltage at output terminal 22. Initially, at time $t_0$, the switch 3 is closed to discharge the capacitor 2, and the integrated voltage is cleared. At $t_1$, the switches 3 and 5 are made open and the switch 6 is closed. Then, the feedback loop of integration capacitor 2 is removed and another feedback loop consisting of the input offset current compensation circuit 40 is formed. This causes a compensation current $i_{com}$ for canceling an input offset current $i_{off}$ to flow through the resistor 10. The resistor 7 and capacitor 8 constitute a hold circuit, and the voltage across the capacitor 8 will converge to a voltage $e_H$ by which the compensation current $i_{com}$ is produced. The period up to this time point defines a compensation period $T_1$, in which the low-pass filter 50 is activated by the closed switch 13 so as to shut the integration amplifier 4 off from unwanted sinusoidal components in the input offset current. Subsequently, at $t_2$, the switch 5 is closed and, at the same time, the switches 6 and 13 are made open, so that the voltage $e_H$ is held by the capacitor 8 and the integration capacitor 2 is inserted in the feedback circuit. The input offset current compensation circuit 40 goes on supplying the current $i_{com}$ to the input of the integration amplifier 4 so as to cancel the offset current $i_{off}$ and, consequently, integration of the true input signal takes place until time point $t_0'$. In this embodiment, application of the input signal current to the input terminal 21 is limited to a period from $t_2$ to $t_3$ within this integration period $T_2$. During the period from $t_2$ to $t_3$, the switch 13 is made open to release the low-pass filter 50, thereby allowing the integrator to catch even small pulsating signals. After the time point $t_3$, the switch 13 is closed to prevent noise pulses from entering into the integrator, and after the time point $t_0'$, the compensating operation for the subsequent integration takes place again.

In the foregoing arrangement, the low-pass filter 50 is made to have a cut-off frequency lower than the upper limit of the response frequency of the offset compensation loop which is mainly determined from the time constant of the resistor 7 and capacitor 8, so that sinusoidal components in the input offset current can be eliminated effectively during the compensating operation.

Figure 3:
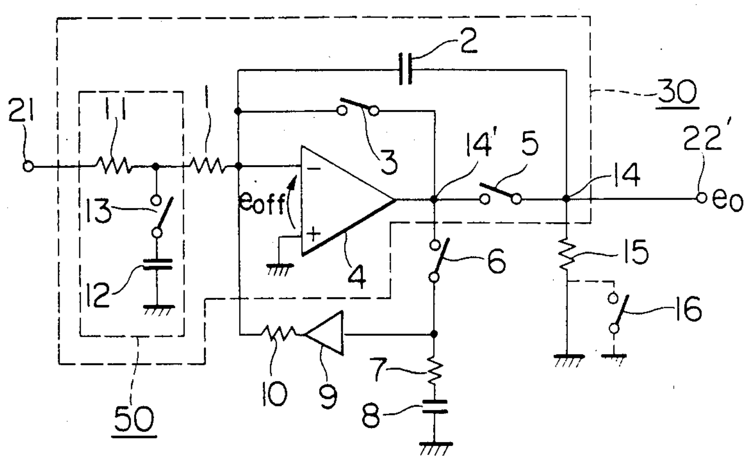
Figure 4:
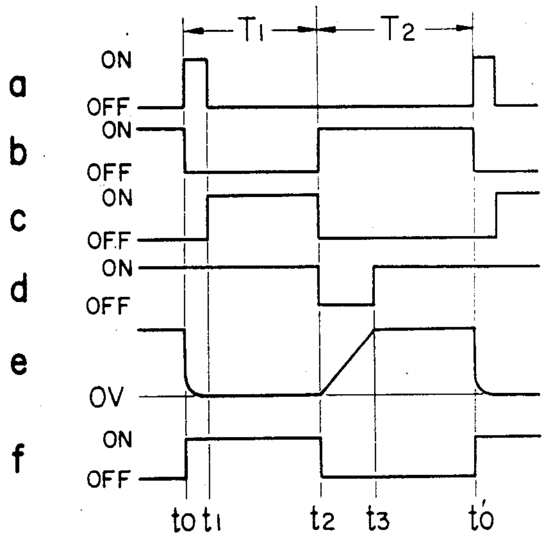

FIG. 3 shows another embodiment of the invention. This embodiment differs from the arrangement of FIG. 1 in that a current limiting resistor 15 is connected between the node 14 of the switch 5 and integration capacitor 2 and ground, and that the output signal is led out from the node 14 to output terminal 22'. The operation of the switches 3, 5, 6 and 13 are as shown by a, b, c and d, respectively, in FIG. 4. In this arrangement, the capacitor 2 is discharged through the resistor 15 in the compensation period $T_1$, and the capacitor voltage is completely cleared even if the amplifier 4 has its own offset voltage $e_{off}$. Taking out the output voltage not from the input side 14' but from the output side 14 of the switch 5 allows the use of a switching device, such as a bipolar transistor, having an ON-state resistance to obtain at the output terminal 22' an accurate integrated voltage produced across the capacitor 2. During the compensation period, the switch 13 is closed to form a low-pass filter so that the voltage $e_H$ held in the capacitor 8 is not affected by sinusoidal components in the input offset current, as in the case of the first embodiment shown in FIG. 1. As shown by the dashed line in FIG. 3, the resistor 15 may be grounded through a switch 16 which is closed during the compensation period $T_1$ and made open during the integration period $T_2$ as shown by f in FIG. 4. This modified arrangement allows the current limiting resistor 15 to float from ground during the integration period $T_2$, making it possible to use a resistor of smaller value as the resistor 15 because the amplifier 4 will not be loaded by the resistor 15. Therefore, the time needed for resetting the integrator can be reduced.

Figure 5:
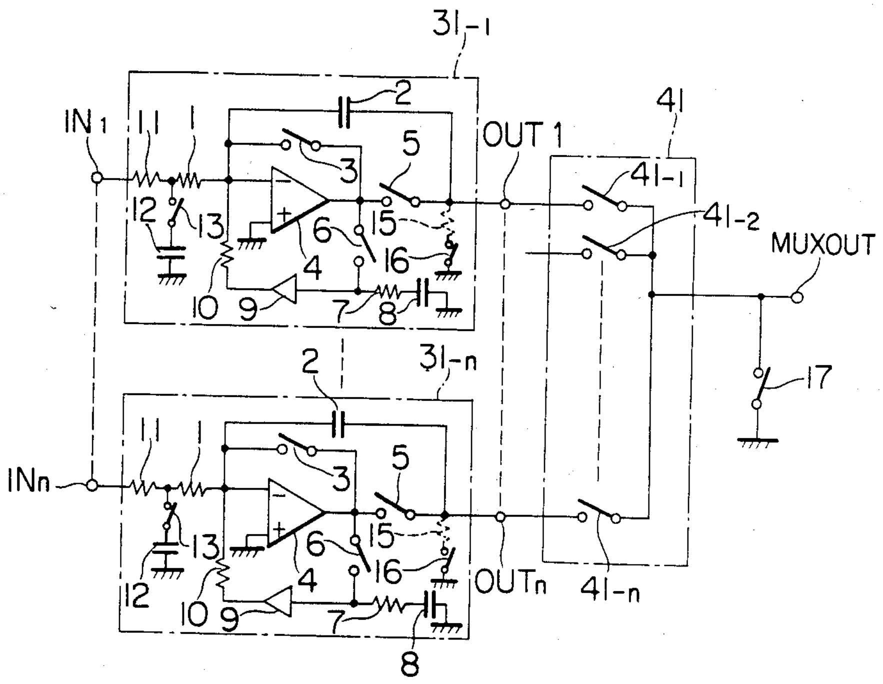

FIG. 5 shows, as an example, the input circuit of the A/D converter used in the X-ray CT system to which the present invention is applied. The arrangement includes the same integral-type input circuits 31-1 through 31-n as that shown in FIG. 3, input terminals $IN_1$ through $IN_n$ for receiving the outputs of respective X-ray sensors directly or through associated preamplifiers, output terminals $OUT_1$ through $OUT_n$ of the input circuits, an analog multiplexer 41 incorporating switches 41-1 through 41-n corresponding to the output terminals of the input circuits, and an output terminal MUXOUT of the overall arrangement. Other portions identical to those of FIG. 1 or 3 are shown with the common reference numbers. A switch 17 functions identically to the switch 16 shown in FIG. 3, but in this case a single switch is provided at the output of the analog multiplexer 41 and used commonly by the input circuits 31-1 through 31-n.

Figure 6:
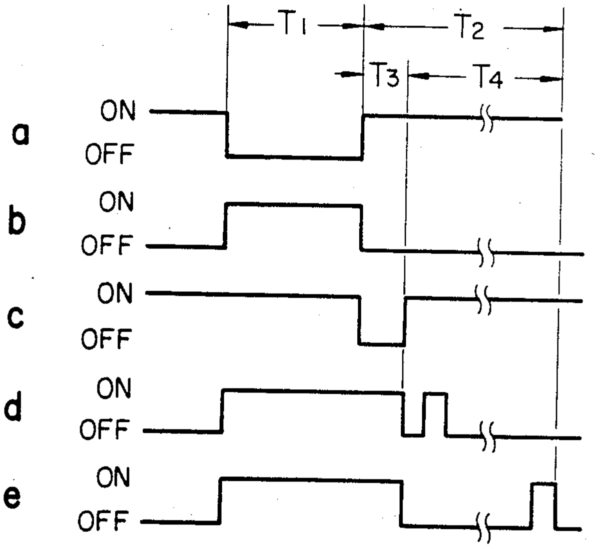

In FIG. 6, waveform a shows the operation of the switch 5 used in each of the input circuits 31-1 through 31-n. The switch 5 is made open during the compensation period $T_1$ and closed during the integration period $T_2$, both periods being common to all input circuits. On the other hand, the operation of the switch 17 is exactly opposite to that of the switch 5, as shown by b in FIG. 6. A period $T_3$ shown in FIG. 6 is used by the X-ray CT system for irradiating X-rays toward the sensors, and the switch 13 in each input circuit is made open during this period so as to release the associated low-pass filter.

The switches 41-1 through 41-n in the analog multiplexer 41 are all closed during the compensation period $T_1$ and X-ray irradiation period $T_3$, and they are closed sequentially one at a time from 41-1 to 41-n. Waveforms d and e in FIG. 6 show the ON and OFF states of the switches 41-1 and 41-n, respectively. In this embodiment, the ON-state resistance (order of 100–1000 ohms) of each analog multiplexer switch 41-1 through 41-n located between each integration capacitor 2 and output terminal MUXOUT functions identically to the current limiting resistor 15 in the arrangement of FIG. 3 during the compensation period $T_1$. Accordingly, the resistor 15 and switch 16 shown by the dashed line in FIG. 5 are not actually needed.

While particular embodiments of the present invention have been described, the invention is not limited thereto and various changes and modifications are possible without departing from the spilit of the invention.

We claim:

1. An integral-type small signal input circuit comprising:

a Miller integrator having an input resistor with its one terminal receiving an input signal, an amplifier connected to another terminal of said input resistor, and an integration capacitor forming a feedback loop of said amplifier during a period of integration; and an input offset current compensation circuit having voltage hold means and a compensation amplifier and adapted to form a feedback loop of said integration amplifier during a period of compensation between consecutive integration periods and supply a compensation current corresponding to a voltage held in said hold means to the input of said integration amplifier during said integration period, said input resistor being provided at said one terminal with a low-pass filter which operates during said compensation period, but is released from operation in at least part of said integration period.

2. An integral-type small signal input circuit according to claim 1, wherein said low-pass filter is released from operation only during a period when said input signal exists.

3. An integral-type small signal input circuit according to claim 1, wherein said low-pass filter has a cut-off frequency which is lower than the upper limit of the response frequency of said input offset current compensation circuit.

4. An integral-type small signal input circuit according to claim 1, wherein one terminal of said integration capacitor is connected to the output of said integration amplifier through switch means which is closed during said integration period, an integrated voltage being led out from a node between said switch means and said terminal of said integration capacitor.

5. An integral-type small signal input circuit according to claim 4, wherein said node between said switch means and said integration capacitor is grounded through a current limiting resistor for discharging said integration capacitor.

6. An integral-type small signal input circuit according to claim 5 further comprising an analog multiplexer connected to said node between said switch means and said integration capacitor for selectively leading out said integrated voltage, an ON-state resistance of said analog multiplexer being used as said current limiting resistor.

* * * * *